(12) United States Patent
Kresge et al.

(10) Patent No.: US 7,595,454 B2
(45) Date of Patent: Sep. 29, 2009

(54) METHOD OF MAKING A CIRCUITIZED SUBSTRATE WITH ENHANCED CIRCUITRY AND ELECTRICAL ASSEMBLY UTILIZING SAID SUBSTRATE

(75) Inventors: John S. Kresge, Binghamton, NY (US); Cheryl L. Palomaki, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 336 days.

(21) Appl. No.: 11/590,888

(22) Filed: Nov. 1, 2006

(65) Prior Publication Data

US 2008/0098595 A1    May 1, 2008

(51) Int. Cl.
*H01R 12/14*    (2006.01)
(52) U.S. Cl. .................. 174/262; 174/264
(58) Field of Classification Search .......... 174/262, 174/264; 361/780, 788, 794; 29/852
See application file for complete search history.

(56) References Cited

U.S. PATENT DOCUMENTS

| | | | |
|---|---|---|---|
| 5,091,339 A * | 2/1992 | Carey ................ | 216/18 |
| 5,539,175 A | 7/1996 | Smith et al. | |
| 5,574,630 A | 11/1996 | Kresge et al. | |
| 5,798,563 A | 8/1998 | Feilchenfeld et al. | |
| 5,874,369 A * | 2/1999 | Farooq et al. ............ | 438/707 |
| 6,040,552 A | 3/2000 | Jain et al. | |
| 6,351,393 B1 | 2/2002 | Kresge et al. | |
| 6,483,074 B2 | 11/2002 | Kresge | |
| 6,815,837 B2 | 11/2004 | Alcoe | |
| 6,828,514 B2 * | 12/2004 | Chan et al. ............. | 174/262 |
| 6,992,896 B2 | 1/2006 | Fraley et al. | |
| 7,024,764 B2 | 4/2006 | Kresge et al. | |
| 7,035,113 B2 | 4/2006 | Fraley et al. | |
| 7,183,196 B2 * | 2/2007 | Muramatsu et al. ....... | 438/622 |
| 2005/0251997 A1* | 11/2005 | Homg et al. ............ | 29/830 |

* cited by examiner

*Primary Examiner*—Dean A. Reichard
*Assistant Examiner*—Yuriy Semenenko
(74) *Attorney, Agent, or Firm*—Hinman, Howard & Kattell; Lawrence R. Fraley; Mark Levy

(57) ABSTRACT

A method of making a circuitized substrate in which pairs of vertically oriented though holes are formed such that at least one of the through holes is partially embedded within a lower one, thus assuring a sound connection following subsequent lamination or other steps the substrate including such holes is subjected to during manufacture. An electrical assembly including a substrate with such features is also provided.

22 Claims, 2 Drawing Sheets

METHOD OF MAKING A CIRCUITIZED SUBSTRATE WITH ENHANCED CIRCUITRY AND ELECTRICAL ASSEMBLY UTILIZING SAID SUBSTRATE

TECHNICAL FIELD

The present invention relates, in general, to methods of making circuitized substrates such as printed circuit boards (hereinafter also referred to as PCB's), chip carriers and the like. Even more particularly, the invention relates to such methods designed for providing highly dense circuit patterns such that the substrates produced using the teachings herein will comply with today's demanding operational requirements for the products utilizing same. One example of such a product is known in the art as an electronic package.

BACKGROUND OF THE INVENTION

Electronic packages and similar products which include organic laminate substrates have been and continue to be developed for many of today's applications. One primary example of such a product is a chip carrier sold under the name HyperBGA by the Assignee of this invention, Endicott Interconnect Technologies, Inc. (HyperBGA is a registered trademark of Endicott Interconnect Technologies, Inc.) These carriers are able to accommodate one or more semiconductor chips thereon and therefore are able to displace the earlier developed ceramic substrates in many chip carrier applications, primarily because of reduced cost and enhanced electrical performance. The use of a multi-layered interconnect structure such as an organic, laminate chip carrier for interconnecting a semiconductor chip to a printed circuit board in an electronic package introduces many challenges. One of the most significant challenges facing such highly miniaturized products is the challenge to provide the necessary, highly dense circuit patterns able to conduct the high frequency (speed) signals from the positioned chip(s) to the underlying supporting substrate on which the carrier is positioned.

As semiconductor chip input/output (I/O) counts increase (especially beyond the capability of peripheral lead devices) and as the need for both semiconductor chip and printed circuit board miniaturization increases, carriers of the type defined above offer the best practical solutions to interconnecting the chips and underlying PCB. In order to satisfactorily provide such interconnection, however, the carrier circuitry itself must assure optimum signal passage. That is, there can be virtually no impediments to effective, high frequency signal transference through the package itself. As understood from the following, one of the main aspects of the present invention is to provide a method of making a substrate with enhanced wiring (circuitry) in which different levels of circuitry within the substrate are effectively interconnected in such a manner that high densification is reliably assured. These interconnections are provided by plated through holes (hereinafter also PTH's) which are formed in a new and unique manner to function cooperatively with other circuit wiring (e.g., lines) connected thereto to provide enhanced paths for the signals passing there-through. It is believed that such a method will constitute a significant advancement in the art.

Various electronic packages and methods relating to the manufacture of the substrates thereof are defined in the following U.S. Letters Patents. This list is not all-inclusive however, as it is fully understood that there are many additional patents which also describe various packages and methods. The following is thus meant only to be representative of some of those known in the art. The listing is not an admission that any of those identified are prior art to the present invention.

In U.S. Pat. No. 7,035,113, there is defined a multi-chip electronic package which utilizes an organic, laminate chip carrier and a plurality of semiconductor chips positioned on an upper surface of the carrier. The organic, laminate chip carrier is comprised of a plurality of conductive planes and dielectric layers and couples the chips to underlying conductors on the bottom surface thereof. The carrier may include a high-speed portion to assure high-frequency connection between the semiconductor chips and may also include an internal capacitor and/or thermally conductive member for enhanced operational capabilities. U.S. Pat. No. 7,035,113 is assigned to the same assignee as the present invention.

In U.S. Pat. No. 7,024,764, there is described a method of making an electronic package. The method includes forming a semiconductor chip and a multi-layered interconnect structure. The semiconductor chip includes a plurality of contact members on one of its surfaces that are connected to the multi-layered interconnect structure by a plurality of solder connections. The formed multi-layered interconnect structure is adapted for electrically interconnecting the semiconductor chip to a circuit board with another plurality of solder connections and includes a thermally conductive layer comprised of a material having a selected thickness and coefficient of thermal expansion to substantially prevent failure of the solder connections between said first plurality of electrically conductive members and the semiconductor chip. The method forms the electronic package to further include a dielectric material having an effective modulus to assure sufficient compliancy of the multi-layered interconnect structure during operation.

In U.S. Pat. No. 6,992,896, there is defined a multi-chip electronic package which utilizes an organic, laminate chip carrier and a pair of semiconductor chips positioned on an upper surface of the carrier in a stacked orientation. The organic, laminate chip carrier is comprised of a plurality of conductive planes and dielectric layers and couples one or both of the chips to underlying conductors on the bottom surface thereof. The carrier may include a high-speed portion to assure high-frequency connection between the semiconductor chips and may also include an internal capacitor and/or thermally conductive member for enhanced operational capabilities. The first chip, e.g., an ASIC chip, is solder bonded to the carrier while the second chip, e.g., a memory chip, is secured to the first chip's upper surface and coupled to the carrier using a plurality of wire-bond connections. U.S. Pat. No. 6,992,896 is also assigned to the same assignee as the present invention.

In U.S. Pat. No. 6,815,837, there is defined an electronic package and information handling system utilizing same wherein the package's substrate includes an internally conductive layer coupled to an external pad and of a size sufficiently large enough to substantially prevent cracking, separation, etc. of the pad when the pad is subjected to a tensile pressure of about 1.4 grams per square mil or greater. U.S. Pat. No. 6,815,837 is also assigned to the same assignee as the present invention.

In U.S. Pat. No. 6,483,074, there is described a laser system for micro via formation directly over a plated through hole (PTH) within a printed circuit board. The laser system forms the micro via directly over the PTH with full dielectric removal from a capture pad while maintaining the dielectric within the PTH to a substantially flush level with the surface of the capture pad. This patent states that it is undesirable to remove dielectric from the hole and hence the reason for leaving the dielectric at the flush level. This patent further states that conventional Gaussian distribution and uniform distribution are less desirable because these energy distributions tend to remove dielectric material within the opening of the PTH, which may lead to reliability problems caused by entrapped plating solution. It will be understood from the teachings herein that the present invention represents a significant improvement over the process defined in U.S. Pat. No. 6,483,074 because it teaches removal of dielectric from within a PTH to a selected level sufficient that the interior walls of the PTH may be plated with metal as well as the exposed upper surface of the dielectric within the lower PTH. The advantages of such a "capped" arrangement are explained in the instant application.

In U.S. Pat. No. 6,351,393, there is described an electronic package and method of making the electronic package wherein the package includes a semiconductor chip and a multi-layered interconnect structure. The semiconductor chip includes a plurality of contact members on one of its surfaces that are connected to the multi-layered interconnect structure by a plurality of solder connections. The multi-layered interconnect structure is adapted for electrically interconnecting the semiconductor chip to a circuitized substrate (eg., circuit board) with another plurality of solder connections and includes a thermally conductive layer being comprised of a material having a selected thickness and coefficient of thermal expansion to substantially prevent failure of the solder connections between said first plurality of electrically conductive members and the semiconductor chip. The electronic package further includes a dielectric material having an effective modulus to assure sufficient compliancy of the multi-layered interconnect structure during operation.

In U.S. Pat. No. 6,040,552, there is described a via-drilling system for forming vias in substrates, and more particularly to a low-cost, high-throughput drilling system for micro-via arrays, wherein energy from a single high-energy laser beam is multiplexed into multiple sub-beams to provide a related finite number of patterning beam lines, each beam line being equipped with appropriate mask-projection optics, for simultaneously drilling a finite number of separate, high-quality, mask-controlled multiple-micro-via patterns into a substrate.

In U.S. Pat. No. 5,798,563, there is described an organic chip carrier for use with flip chips, comprising an organic dielectric layer, a first layer of circuitry disposed on the dielectric layer, an organic conformational coating disposed over the first layer of dielectric and the first layer of circuitry, and a layer of fine line circuitry having line width of about 2.0 mil or less, preferably about 1.0 mil or less, preferably about 0.7 mil, and a space between lines of about 1.5 mil or less, preferably about 1.1 mil or less, disposed on the conformational layer. Preferably the dielectric layer is free of woven fiber glass. The conformational coating preferably has a dielectric constant of about 1.5 to about 3.5, and a percent planarization of greater than about 3.5%.

In U.S. Pat. No. 5,574,630, there is described a power/ground structure and associated PCB in which the coefficient of thermal expansion (CTE) of the power/ground structure and associated circuit board are closely matched to each other. The PCB is formed of organic electrically-insulating material having electrical circuitry thereon which carries an integrated circuit chip. The power/ground assembly is formed of alternating layers of organic insulating material and at least two layers of electrically-conducting material, typically copper, one of the layers of electrically-conducting material forming a power connection and another layer of the electrically-conducting material forming a ground plane. There is also at least one additional layer of a structural material having a relatively high Young's Modulus and a CTE of less than about 10 PPM/.degree C. Invar or copper clad Invar are preferred materials for this structure. The electrically-conducting copper material and the Invar are selected in thickness and number such that, together with the electrically-insulating material, the composite CTE of the power/ground structure closely matches that of the circuit card or board.

In U.S. Pat. No. 5,539,175, there is described both method and apparatus for laser ablation of openings with a specified wall profile in materials such as polyimide. The method includes identifying the opening profile of choice. This profile of choice is then divided into convex portions which can be "stably" formed and concave portions which are "unstably" formed. With respect to convex portions of apertures, after ablation to their desired depth, these convex portions remain substantially unchanged with additional exposure to otherwise ablating radiation. With respect to concave portions of apertures, these concave portions change with additional exposure to ablating radiation. Accordingly, techniques are disclosed for controlling exposure to ablating radiation, controlling the profile of the ablating radiation, or both. In either case, the intensity profile of the working image containing the ablating light is shaped in accordance with the depth and slope of the sidewalls of the opening desired. Intensity of the working image is tailored across the opening to levels above the ablation threshold in accordance with the desired wall shape. Exposure to ablating radiation occurs with this exposure closely monitored only in the case of unstable concave profiles. The technique can be practiced with imaging systems or, preferably, practiced with masks containing computer generated holograms where light efficiencies are improved.

As mentioned above, the present invention represents a significant improvement in the art of manufacturing circuitized substrates, including particularly over the process defined in U.S. Pat. No. 6,483,074 cited above, because it teaches the formation of a "capped" or interlocking arrangement of vertically oriented conductive through-holes, thereby assuring a sound, effective connection between adjacent conductive elements in a multi-layered substrate structure. The invention is able to do so in a highly dense pattern, if needed, to thus meet today's more stringent operational requirements for products using such substrates. Other advantages of the invention are discernible from the teachings herein. It is believed that such an invention will represent a significant advancement in the art.

OBJECTS AND SUMMARY OF THE INVENTION

Accordingly, it is a primary object of this invention to enhance the art of making circuitized substrates and particularly that portion of the art relating to through-hole formation.

It is another object of this invention to provide such a method which can be cost effectively performed, utilizing, for the most part, conventional circuitized substrate manufacturing equipment.

It is yet another object of the invention to provide such a method which will enable the formation of high density patterns of such through-holes and other associated circuit elements such as circuit lines and/or pads which may be utilized in combination therewith.

According to one aspect of the invention, there is provided a method of making a circuitized substrate which comprises providing a first layer of dielectric material, forming a first conductive through-hole within this first layer of dielectric material, the conductive through-hole including a land portion and a barrel portion, applying a second layer of dielectric material over the first conductive through-hole including the land portion such that a portion of the dielectric material of said second layer will substantially fill the conductive through-hole, removing a part of the dielectric material of the second layer from above the land portion and from a predetermined depth within the conductive through hole, this removing resulting in the formation of internal walls of dielectric material having a predefined configuration and an upper surface of the dielectric material at the predetermined level within the through hole, and plating metallurgy on the internal walls of dielectric material, on the internal walls of the through hole to substantially the predetermined depth, and on the upper surface of the dielectric material, to form a second conductive through-hole electrically coupled to and partially positioned within the conductive through-hole within the first layer of dielectric material.

According to another aspect of the invention, there is provided an electrical assembly comprising a circuitized substrate including a first layer of dielectric material, a first plated through hole within the first layer of dielectric material and including a land portion and a barrel portion, a second layer of dielectric material positioned on the first layer of dielectric material, and a second plated through hole within this second layer of dielectric material, the second plated though hole extending a predetermined depth within the first plated through hole, and an electrical component positioned on the circuitized substrate and electrically coupled to the second plated through hole.

BEST MODE FOR CARRYING OUT THE INVENTION

Figure 1:
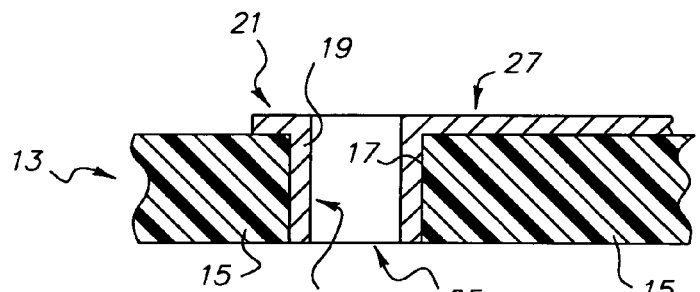
FIGS. 1-4 are partial side elevational views, in section and on a much reduced scale, showing the steps of making a circuitized substrate, according to one embodiment of the invention.

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "circuitized substrate" as used herein is meant to include substrates having at least two (and preferably more) dielectric layers and at least three (and preferably more) electrically conductive layers, these layers being typically arranged in an alternating manner. Examples of dielectric materials usable for such substrates include fiberglass-reinforced epoxy resins (some referred to as "FR4" dielectric materials in the art, for the flame retardant rating of same), polytetrafluoroethylene (e.g., Teflon), polyimides, polyamides, cyanate resins, photo-imageable materials and other like materials. Examples of conductor materials usable in conductive layers for such substrates include copper or copper alloys, but may include or comprise additional metals (e.g., nickel, aluminum, etc.) or alloys thereof. One example of a dielectric-conductor member for possible use in the invention is one called resin coated copper (RCC), in which the resin may be inorganically filled or unfilled, and includes a copper layer thereon. The conductor materials are used to form layers which may serve as power, signal and/or ground layers. If as a signal layer, several conductor lines and/or pads may constitute the layer, while if used as power or ground, such layers will typically be of substantially solid construction. Combinations of both signal and power and/or ground layers are possible. Examples of circuitized substrates include the aforementioned printed circuit boards (or cards) and chip carriers. It is believed that the teachings of the instant invention may also be applicable to what are known in the art as "flex" (thin) circuits (which use dielectric materials such as polyimide).

By the term "electrical assembly" is meant at least one circuitized substrate as defined herein in combination with at least one electrical component (defined below) electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes.

By the term "electrical component" as used herein is meant components such as semiconductor chips and the like which are adapted for being positioned on the external conductive surfaces of circuitized substrates and electrically coupled to the substrate for passing signals from the component into the substrate whereupon such signals may be passed on to other components, including those mounted also on the substrate, as well as other components such as those of a larger electrical system which the substrate forms part of.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

By the term "through hole" as used herein is meant to include electrically conductive holes which extend a partial depth within a substrate (also referred to in the art as a "blind via"), electrically conductive holes which are entirely internal of the substrate (also referred to as "buried vias") and electrically conductive holes which extend entirely through the substrate. The term "through" is thus meant that the hole extends through at least one layer of dielectric material. By the term "plated through hole" is meant a "through hole" which is plated with metallurgy on the internal walls thereof, the metallurgy serving as the electrically conductive medium. It is within the scope of this invention to also provide electrically conductive paste or the like material within the plated through holes as a secondary path for electrical signals.

In FIG. 1, there is shown a partial view of a first layer 13 of dielectric material 15 which may be used in the present invention. In one example, layer 13 is of rectangular configuration with side and length dimensions of about 1574 mils (a mil being 0.001 inch) by about 1574 mils (thus, this example is square), and a thickness of about thirteen mils. Material 15 is preferably one of those defined above, one example being the mentioned "FR4" dielectric. Within layer 13 is formed a plurality of openings (or holes) 17 which extend through the layer's thickness. In one embodiment, as many as 4000 such openings may be formed, each with a diameter of about two mils and spaced apart only about nine mils. Only one such opening is shown in FIG. 1, but it is understood that several others are preferably formed, considering the circuit requirements of the finished product using the invention. Layer 13 is subjected to an electroplating operation in which a layer 19 of conductive metal is deposited on the internal walls of the opening, and, in one embodiment, on the upper surface of layer 13 to form a land portion 21 and a barrel portion 23. The result of this formation is a plated through hole 25 (and preferably several such holes, considering that other openings are also plated simultaneously with opening 17). In addition, the land portion may extend outwardly in the form of a signal line or the like. (It is thus understood that a "layer" including several land portions or even just the upper exposed portions of conductive through holes without lands will represent a conductive layer according to the teachings herein. Typically, such conductive layers will further include signal lines or pads or the like as part thereof.) The construction shown in FIG. 1 is thus not meant to limit the invention.

The preferred electroplating operation to form land 21 and barrel portion 23 includes a first electro-less plating step and a second electrolytic plating step. In the first step, a thin strike layer of electroless plated copper (not shown) is deposited with a thickness of only about seventy micro-inches. Following formation of this strike layer, a thicker layer of copper or copper alloy is deposited over the strike layer. This second layer may be about 0.5 mils thick, and is formed using Rohm and Haas Electroposit 1100 Acid Cu Chemistry (available from Rohm And Haas Electronic Materials, having a location at 272 Buffalo Avenue, Freeport, N.Y.). This second plating occurs for approximately fifteen to forty minutes at ambient temperature This second step is different than the described first step (electro-less plating) in which Rohm And Haas Circuposit Electroless Copper 3350 is plated for approximately ten to thirty minutes at 70 degrees Celsius. The invention is not limited to these two steps, however, nor is it limited to the formation of a strike layer prior to the thicker second layer. For example, a singular layer of copper or copper alloy may be deposited on the bare internal dielectric walls of layer 13 using Rohm And Haas Full Additive Cu Plating Chemistry. It is also possible to form the conductive holes using an electrically conductive material other than copper or alloys thereof. For example, the material for layer 19 may be copper or gold filled conductive paste, and deposited by mechanical screening through a metal mask.

The invention is not limited to the particular configuration for the plated through hole 25 shown in FIG. 1. The resulting configuration depends in part on the process used to form the opening within the layer. In one embodiment, a laser is used to form opening(s) 17, and preferably a Nd:YAG laser. Alternatively, mechanical drills may be used. Laser drilling is preferred to give the higher density patterns of openings desired, compared to mechanical drilling which is used when lesser density patterns and/or larger diameter openings are preferred. If a laser is used, the internal walls may have a tapered shape, similar to the shape represented by the letters "T" to the phantom lines in FIG. 3 for the second conductive through hole to be defined below. The shape shown in these Drawings is for illustration purposes only and not limiting of the particular shapes which may be used. Plated through hole 25 may also include a lower land portion and even an extending portion similar to portions 21 and 27 above, if desired. Such lower portions are not shown in FIGS. 1-4, for ease of illustration, but may be seen in the embodiment of FIG. 5.

Figure 2:
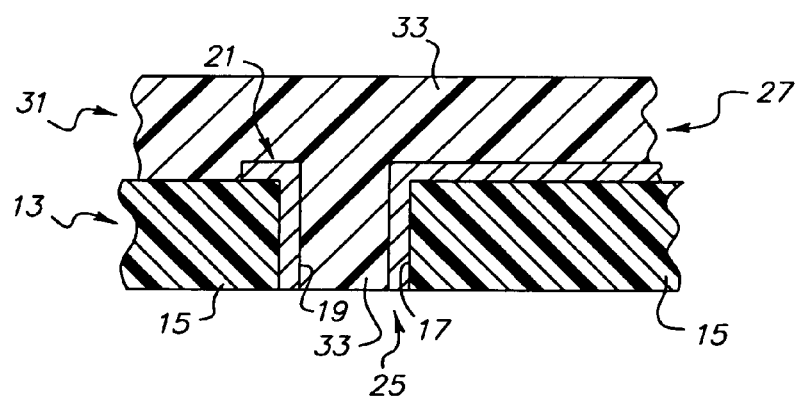

In FIG. 2, a second dielectric layer 31 is bonded to the upper surface of layer 13, preferably using a conventional PCB lamination process at a temperature of from about 200 degrees Celsius (C) to about 240 degrees C. and a pressure of from about 200 pounds per square inch (PSI) to about 400 PSI. The material 33 for layer 31 is preferably the same as layer 13, although another dielectric material from the group listed above may be utilized. The lamination results in the material from layer 31 filling both the barrel and land portions of plated through hole 25. The resulting thickness of layer 31 is only about two mils, leaving both layers 13 and 31 with a total thickness of about fifteen mils. Significantly, if the dual layered structure in FIG. 2 is to be subjected to subsequent lamination (e.g., the addition of more dielectric and conductive layering), then the material for each layer 13 and 31 may be at a condition known as "B-Stage", meaning it has not fully cured but will then be so fully cured in the later lamination step(s). In the example of the present invention as discussed herein, however, the FIG. 2 structure is in a fully cured state.

Figure 3:
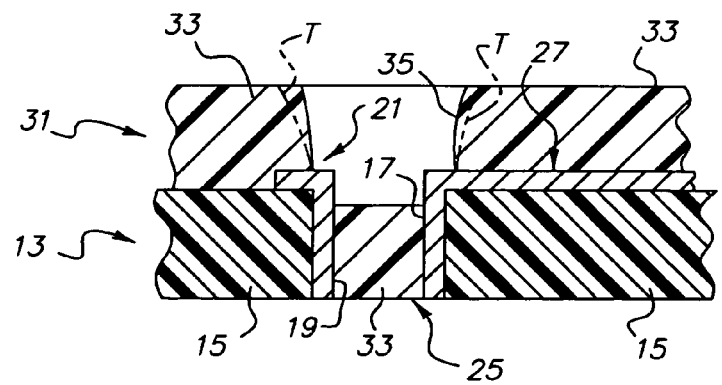

In FIG. 3, a second opening 35 is formed within the material 33 of layer 31 above each of the plated through holes 25 within layer 13. (Again, only one such plated through hole 25 is shown for ease of illustration purposes.) Each opening 35 is preferably formed using a laser, such as a Nd:YAG laser. Significantly, the laser is tuned to the extent that removal of dielectric material 33 above the hole 25 occurs, in addition to partial removal of material 33 from within hole 25. More specifically, material 33 is removed (ablated) from within hole 25 to at least the depth of the land portion 21, in one example a depth of one mil. This is not limiting of the invention, however, as it is possible to remove more material 33, including to a depth of two mils within hole 25, and thus also from within the barrel portion 23. According to the teachings herein, the amount of material removed from hole 25 is to a depth (distance) of from about seven to about fourteen percent of the entire depth of the lower plated through hole 25. Such a depth has proven to provide the desired "anchoring" for the above to-be-formed plated through hole which will connect directly to lower hole 25. As mentioned above, opening 35 may include a tapered configuration represented by the phantom lines "T" in FIG. 3. (The interior walls of opening 25 may have a similar configuration, as also mentioned above.) As stated, a Nd:YAG laser may be used, and preferably one which does not provide a bimodal distribution as is required in the aforementioned U.S. Pat. No. 6,483,074. The use of a bimodal laser as defined in U.S. Pat. No. 6,483,074 is specifically to prevent any dielectric material from being ablated within the lower hole, such that a second plated through hole will be formed only on the upper surfaces of the lower hole.

It has been learned that partial removal of material from within a formed plated through hole and subsequent formation of part of a second plated through hole within the lower plated through hole is both possible, and desirable. As defined herein, such formation assures a sound, effective physical (and electrical) connection between two contiguous conductive elements but also a positive "anchoring" of one within the second, so as to prevent undesirable conductor lateral "shifting" as might occur during subsequent substrate processing (e.g., lamination of additional layers). Still further, partial embedding of one plated through hole within another affords a thinner composite (both dielectric layers) structure, enabling a subsequently also thinner end product. As mentioned above, thinness assures a smaller final product, and thus one that meets many of the miniaturization requirements of today.

Figure 4:
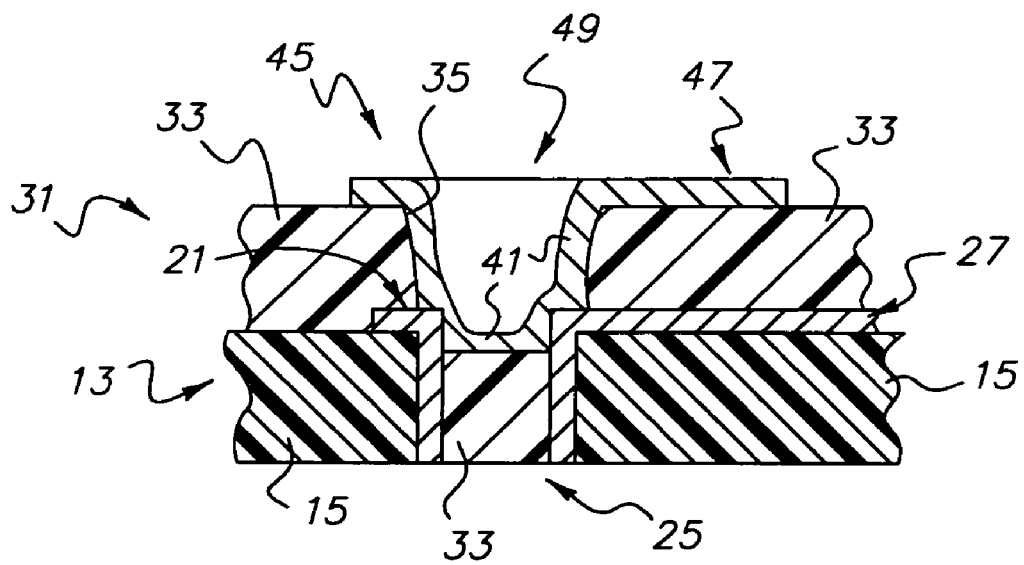

In FIG. 4, the interior walls of opening 35 and, significantly, the internal walls of the land portion 21 of plated through hole 25 and the upper surface of material 33 within hole 25, are plated with metallurgy 41. Preferably, this is accomplished using a similar process used to apply the layering in FIG. 1, in which an electroplating operation involving the first deposition of a strike layer (not shown) occurs following deposition of a thicker metal layer. As in FIG. 1, this involves a first electro-less plating step and a second electrolytic plating step. The resulting layer is preferably from about 0.5 mils to about one mil thick, and as with the first plated through hole 25, may include a land portion 43 and an extending portion 47 (which may be a signal line or other connection structure to a second conductor, including another land portion of another plated through hole nearby). Significantly, the lowermost layer, that atop material 33's upper planar surface, has a thickness nearly equal to that of the side layers on the surfaces of opening 35. In one example, this lower layer's thickness may be from about 0.3 mils to about 0.8 mils thick, compared to the side wall layer thickness of about 0.4 mils to about 0.9 mils. The resulting structure, as seen in FIG. 4, is the formation of a second plated through hole 49 directly atop and partially within the lower hole 25.

It is further possible according to the teachings herein to completely fill the formed second hole 49 with conductive material to form a more robust structure, especially if the final hole configuration is to be an external hole and adapted for having a conductor such as a solder ball bonded thereto. This may be accomplished by a plating operation in which copper or other suitable metallurgy is deposited within the hole until it reaches the upper surface, thereby forming a relatively solid upper surface for hole 49. In another embodiment, it may be possible to fill the hole with conductive paste, several types of which are known in the art, to the hole's upper surfaces. A new conductive, e.g., copper, layer (not shown) may then be added over the upper surface of the paste, providing another form of a solid upper surface for the hole on which such a solder ball may be positioned and bonded.

Figure 5:
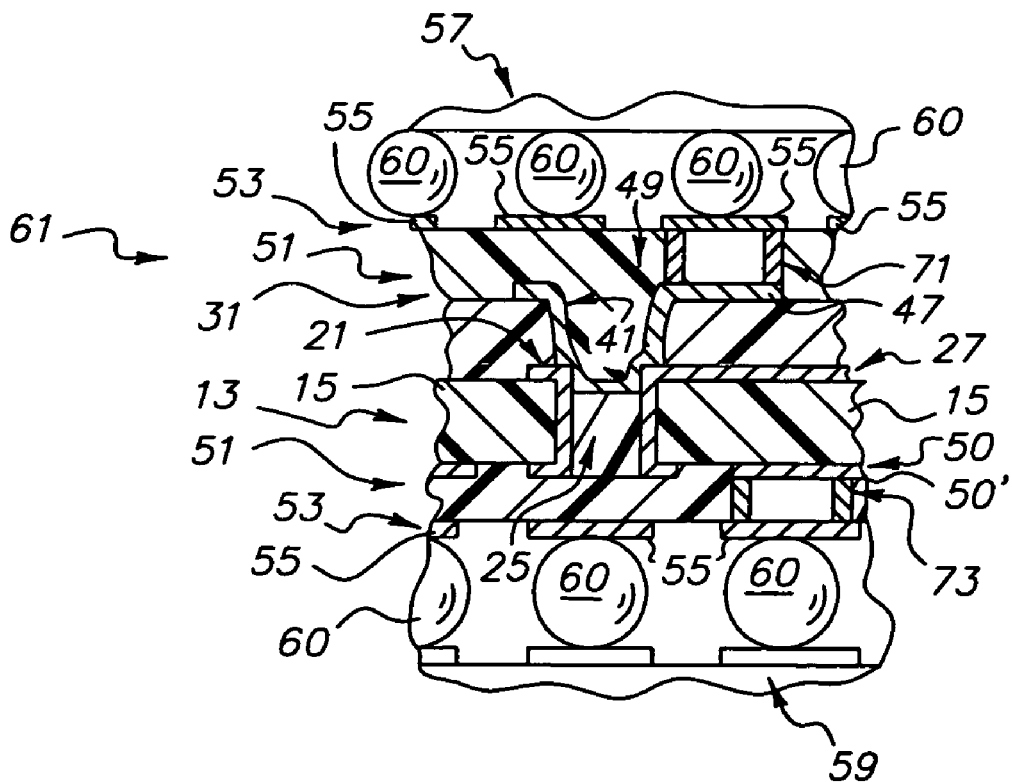
FIG. 5 is a partial side elevational view, in section and on a much reduced scale, showing one example of an electrical assembly utilizing the circuitized substrate of the invention.

FIG. 5 represents an example of the many uses of the circuitized substrate formed in accordance with the teachings herein. In one example, additional dielectric and conductive layers 51 and 53, respectively, may be added to opposite (upper and lower) sides of the FIG. 4 dual dielectric layered embodiment to provide additional circuitry, e.g., should the card or board product be designed to accommodate added electronic components, etc. It is also within the scope of the invention to provide additional layers to only one side of the FIG. 4 structure. More than the number of layers shown may also be provided, again depending on the operational requirements of the final product in which the substrate of the invention is utilized. These added dielectric layers may be added using conventional PCB lamination processing, while the added conductive layers may be added using conventional photolithographic processing in which a single copper or other metal sheet is bonded to the dielectric and then imaged and developed to form the desired pattern (here, conductors) therein.

The lower surface of the FIG. 4 structure may also include another conductive layer 50, including one similar (including land and line portions, as well as other signal lines and/or pads) to the circuitry of the layers having portions 21, 27, 45 and 47. In the embodiment of FIG. 5, layers 53 each include a plurality of conductor pads 55, and may be electrically coupled to the corresponding internal circuitry (such as to the extending line 27 using a plated through hole 71, or to a signal line 50' using a different plated though hole 73). Various other forms of circuitry and connections are readily possible using the teachings herein. The pads on the upper surface may be of smaller size and closer in proximity to one another than those on the lower surface, e.g., should the upper pads be designed to accommodate a small electronic component such as a semiconductor chip 57, while the lower pads may be designed for accommodating a larger substrate such as a printed circuit board 59. The preferred connections between the substrate and chip 57 are provided by conventional solder balls 60, as are the connections between the substrate and lower board 59. The resulting structure of a circuitized substrate (one including a plurality of dielectric layers and internal and external conductive layers, including the unique plated through hole connections therein) and at least one electronic component (here, a chip 57) forms what may be defined as an electrical assembly 61, which in turn may be positioned on and coupled to a separate circuitized substrate (here, a printed circuit board 59). As is understood, various other combinations are readily possible, including utilizing the invention's substrate as a printed circuit board and placement of a separate component such as a semiconductor chip (or a chip carrier, as defined immediately below) thereon. If the substrate of the invention is used as in FIG. 5, it may also be referred to as a chip carrier, considering that it accommodates at least one (and possibly more) chips thereon.

The structure shown in FIG. 5 may also be utilized as part of a larger electronic apparatus, including an information handling system as defined above. To do this, the FIG. 5 embodiment may be simply positioned within a housing conventionally used for such systems (e.g., a computer housing) with the lower board 59 possibly forming the "motherboard" for the system and the multilayered substrate including layers 13, 31, and 51 (and associated conductive layers) being one of a plurality of such assemblies positioned thereon and electrically coupled thereto to accomplish the needed functions of the system. Examples of computer and other system housings, as well as the internal boards, cards and other components thereof, are well known in the art. One such example is shown and defined in U.S. Pat. No. 7,035,113, assigned to the same Assignee as the present invention. For example, board 59 in FIG. 5 could form the substrate 10 shown in FIG. 5 of said patent and the assembly 61 form the "electronic package" also shown in FIG. 5 of said patent, all being positioned within and thus forming part of the electrical system of the housing shown in FIG. 5. The teachings of U.S. Pat. No. 7,035,113 are thus incorporated herein by reference.

There has been shown and described a new circuitized substrate and method of making same in which vertically oriented pairs (two or more if needed) of plated through holes, in which one (the upper) is positioned partly within the lower, are utilized. An electrical assembly using such a substrate has also been shown and described. The advantages of this invention include reduced thickness, more effective electrical coupling between through holes, and enhanced substrate processing.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising:

providing a first layer of dielectric material;

forming a first conductive through-hole within said first layer of dielectric material, said first conductive through-hole including a land portion and a barrel portion;

applying a second layer of dielectric material over said first conductive through-hole including said land portion such that a portion of said dielectric material of said second layer will substantially fill said first conductive through-hole;

removing a part of said dielectric material of said second layer from above said land portion and from a predetermined depth within said first conductive through-hole, said removing resulting in the formation of internal walls of said dielectric material of said second layer having a predefined configuration and an upper surface of said dielectric material of said second layer at said predetermined level within said first conductive through hole; and plating metallurgy on said internal walls of said dielectric material of said second layer, on the internal walls of said first conductive through-hole to substantially said predetermined depth within said first conductive through hole, and on said upper surface of said dielectric material of said second layer, to form a second conductive through-hole electrically coupled to and partially positioned within said first conductive through-hole within said first layer of dielectric material.

2. The method of claim 1 wherein said predefined configuration of said internal walls of said dielectric material of said second layer is tapered.

3. The method of claim 1 wherein said forming of said first conductive through-hole within said first layer of dielectric material including said land portion and said barrel portion is accomplished using an electroplating operation.

4. The method of claim 3 wherein said electroplating operation includes a first electro-less plating step and a second electrolytic plating step.

5. The method of claim 4 wherein said first electro-less plating step provides a thin layer of metal and said second electrolytic plating step provides a second, thicker layer of metal on said thin layer.

6. The method of claim 1 wherein said applying said second layer of dielectric material over said first conductive through-hole including said land portion such that a portion of said dielectric material of said second layer will substantially fill said barrel portion of said first conductive through-hole is accomplished using lamination.

7. The method of claim 1 wherein said removing said part of said dielectric material of said second layer from above said land portion and from a predetermined depth within said first conductive through-hole is accomplished using laser ablation.

8. The method of claim 1 wherein said plating of said metallurgy on said internal walls of said dielectric material of said second layer, on said internal walls of said first conductive through-hole to substantially said predetermined depth within said first conductive through hole, and on said upper surface of said dielectric material of said second layer, to form said second conductive through-hole electrically coupled to said conductive through-hole within said first layer of dielectric material is accomplished using an electroplating operation.

9. The method of claim 8 wherein said electroplating operation includes a first electro-less plating step and a second electrolytic plating step.

10. The method of claim 9 wherein said first electro-less plating step provides a thin layer of metal and said second electrolytic plating step provides a second, thicker layer of metal on said thin layer.

11. The method of claim 1 further including electrically coupling an electrical component to said second electrically conductive through hole, said circuitized substrate and said electronic component comprising an electrical assembly.

12. The method of claim 11 wherein said electrical component is a semiconductor chip, said electrically coupling of said semiconductor chip to said second electrically conductive through-hole being accomplished utilizing a plurality of solder elements.

13. The method of claim 11 further including electrically coupling said circuitized substrate to a second circuitized substrate.

14. The method of claim 13 wherein said second circuitized substrate is a printed circuit board, said electrically coupling of said circuitized substrate to said second circuitized substrate being accomplished utilizing a plurality of solder elements.

15. The method of claim 13 further including providing a housing and thereafter positioning said electrical assembly within said housing, said housing and said electrical assembly comprising an information handling system.

16. The method of claim 11 further including filling said second conductive through-hole with conductive material.

17. An electrical assembly comprising: a circuitized substrate including a first layer of dielectric material, a first plated through hole within said first layer of dielectric material and including a land portion and a barrel portion, a second layer of dielectric material positioned on said first layer of dielectric material and substantially filled said first plated through hole, and a second plated through hole within said second layer of dielectric material, said second plated though hole extending a predetermined depth within said first plated through hole; and an electrical component positioned on said circuitized substrate and electrically coupled to said second plated through hole.

18. The electrical assembly of claim 17 wherein said dielectric material of said first and second layers is selected from the group consisting of fiberglass-reinforced epoxy resin, polytetrafluoroethylene, polyimide, polyamide, cyanate resin, photo-imageable material, and combinations thereof.

19. The electrical assembly of claim 17 wherein said first and second plated through holes include at least one layer of copper or copper alloy on the internal walls thereof, part of said layer of copper or copper alloy of said second plated through hole also being located on part of said layer of copper or copper alloy substantially within said land portion of said first plated through hole.

20. The electrical assembly of claim 17 wherein said part of said layer of copper or copper alloy of said second plated through hole which is also located on said part of said layer of copper or copper alloy substantially within said land portion of said first plated through hole extends a distance of from about seven to about fourteen percent of the entire depth of said first plated through hole.

21. The electrical assembly of claim 17 wherein said electrical component is a semiconductor chip and said circuitized substrate is a chip carrier.

22. The electrical assembly of claim 17 wherein said electrical component is a chip carrier and said circuitized substrate is a printed circuit board.

* * * * *